US012761567B2

(12) United States Patent
Tarau et al.

(10) Patent No.: US 12,761,567 B2
(45) Date of Patent: Oct. 13, 2026

(54) LITHOGRAPHIC PERFORMANCE QUALIFICATION AND ASSOCIATED APPARATUSES

(71) Applicant: ASML NETHERLANDS B.V., Veldhoven (NL)

(72) Inventors: Alina Nicoleta Tarau, Waalre (NL); Robert Bastiaan Clark De Korte, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 155 days.

(21) Appl. No.: 18/723,849

(22) PCT Filed: Dec. 15, 2022

(86) PCT No.: PCT/EP2022/086217

§ 371 (c)(1),
(2) Date: Jun. 24, 2024

(87) PCT Pub. No.: WO2023/134957

PCT Pub. Date: Jul. 20, 2023

(65) Prior Publication Data

US 2025/0044707 A1 Feb. 6, 2025

(30) Foreign Application Priority Data

Jan. 14, 2022 (EP) .................................... 22151600

(51) Int. Cl.
*G03F 7/00* (2006.01)
*G03F 9/00* (2006.01)

(52) U.S. Cl.
CPC ...... *G03F 7/70525* (2013.01); *G03F 7/70433* (2013.01); *G03F 7/70858* (2013.01); *G03F 9/7011* (2013.01)

(58) Field of Classification Search
CPC ............. G03F 7/70433; G03F 7/70525; G03F 7/70858; G03F 9/7011
See application file for complete search history.

(56) References Cited

U.S. PATENT DOCUMENTS 5,973,766 A 10/1999 Matsuura et al.
6,952,253 B2 10/2005 Lof et al.
(Continued)

FOREIGN PATENT DOCUMENTS

CN 101459096 A * 6/2009

OTHER PUBLICATIONS

International Search Report and Written Opinion issued in corresponding PCT Patent Application No. PCT/EP2022/086217, dated Jan. 25, 2023.

(Continued)

*Primary Examiner* — Peter B Kim
(74) *Attorney, Agent, or Firm* — Pillsbury Winthrop Shaw Pittman, LLP

(57) ABSTRACT

A method of performing a lithographic performance qualification test. The method includes: obtaining one or more exposure layouts, each relating to exposure of multiple exposure fields on a substrate; performing a dummy exposure on a substrate including photoresist for each of the one or more exposure layouts, the dummy exposure using no exposure illumination or exposure illumination having an exposure energy below an exposure threshold of the photoresist; monitoring one or more exposure parameters of each dummy exposure to obtain exposure parameter data; and evaluating lithographic performance of each dummy exposure and/its corresponding exposure layout from the exposure parameter data respective to that dummy exposure.

20 Claims, 1 Drawing Sheet

(56) References Cited

U.S. PATENT DOCUMENTS

| | | | | |
|---|---|---|---|---|
| 10,551,746 | B2 | 2/2020 | Smeets et al. | |
| 2002/0146628 | A1 | 10/2002 | Ota | |
| 2005/0139790 | A1 | 6/2005 | Boogaarts et al. | |
| 2005/0286036 | A1 * | 12/2005 | Lee ........................ | G03F 9/7011 355/69 |
| 2007/0076180 | A1 | 4/2007 | Tinnemans et al. | |
| 2014/0185030 | A1 | 7/2014 | Hotzel et al. | |

OTHER PUBLICATIONS

Anonymous, "Lithography machine calibration", Research Disclosure. No. 531017, pp. 1-3 (2008).

* cited by examiner

LITHOGRAPHIC PERFORMANCE QUALIFICATION AND ASSOCIATED APPARATUSES

CROSS-REFERENCE TO RELATED APPLICATIONS

This application is the U.S. national phase entry of PCT Patent Application No. PCT/EP2022/086217 which was filed on Dec. 15, 2022, which claims priority of European Patent Application No. 22151600.8 which was filed on Jan. 14, 2022 and which is incorporated herein in its entirety by reference.

FIELD

The present disclosure relates to processing of substrates for the production of, for example, semiconductor devices.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use radiation. The wavelength of this radiation determines the minimum size of features which can be formed on the substrate. Typical wavelengths currently in use are about 365 nm (i-line), about 248 nm, about 193 nm and about 13 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of about 193 nm.

Low-k1 lithography may be used to process features with dimensions smaller than the classical resolution limit of a lithographic apparatus. In such a process, the resolution formula may be expressed as $CD=k1\times\lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and k1 is an empirical resolution factor. In general, the smaller k1 the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of a numerical aperture (NA,) a customized illumination scheme, use of one or more phase shifting patterning devices, optimization of the design layout such as optical proximity correction (OPC) in the design layout, or other methods generally defined as resolution enhancement techniques (RET). Additionally or alternatively, one or more tight control loops for controlling the stability of the lithographic apparatus may be used to improve reproduction of the pattern at low k1.

The accurate placement of patterns on the substrate is a chief challenge for reducing the size of circuit components and other products that may be produced by lithography. In particular, the challenge of measuring accurately the features on a substrate which have already been laid down is a critical step in being able to align successive layers of features in superposition accurately enough to produce working devices with a high yield. So-called overlay should, in general, be achieved within a few tens of nanometers in today's sub-micron semiconductor devices, down to a few nanometers in the most critical layers.

Consequently, modern lithography apparatuses involve extensive measurement or 'mapping' operations prior to the step of actually exposing or otherwise patterning the substrate at a target location. So-called advanced alignment models have been and continue to be developed to model and correct more accurately non-linear distortions of the wafer 'grid' that are caused by processing steps and/or by the lithographic apparatus itself. Not all distortions are correctable during exposure, however, and it remains important to trace and eliminate as many causes of such distortions as possible.

Lithographic performance is dependent on the exposure layout, such as inter alia: field size, field layout, intrafield layout (e.g., number of dies and their arrangement) and alignment mark or other feature locations.

An improved method for qualifying lithographic performance is desirable.

SUMMARY

In a first aspect of the invention there is provided a method of performing a lithographic performance qualification test, the method comprising: obtaining exposure layout data describing multiple exposure layouts, each exposure layout relating to exposure of multiple exposure fields on a substrate;

- performing one or more dummy exposure on a substrate comprising photoresist for each of said one or more exposure layouts, said dummy exposure using no exposure illumination or exposure illumination having an exposure energy below an exposure threshold of said photoresist;
- monitoring one or more exposure parameters of each dummy exposure to obtain exposure parameter data; and
- identifying the exposure layout and/or exposure parameters with a best and/or worst performance by evaluating lithographic performance of each dummy exposure and/or its corresponding exposure layout from the exposure parameter data respective to that dummy exposure.

In a further aspect of the invention, there is provided a computer program comprising program instructions operable to perform the method of the first aspect when run on a suitable apparatus, and associated processing apparatus and lithographic apparatus.

BRIEF DESCRIPTION OF THE DRAWINGS

Embodiments of the invention will now be described, by way of example only, with reference to the accompanying schematic drawings, in which.

DETAILED DESCRIPTION

Figure 1:
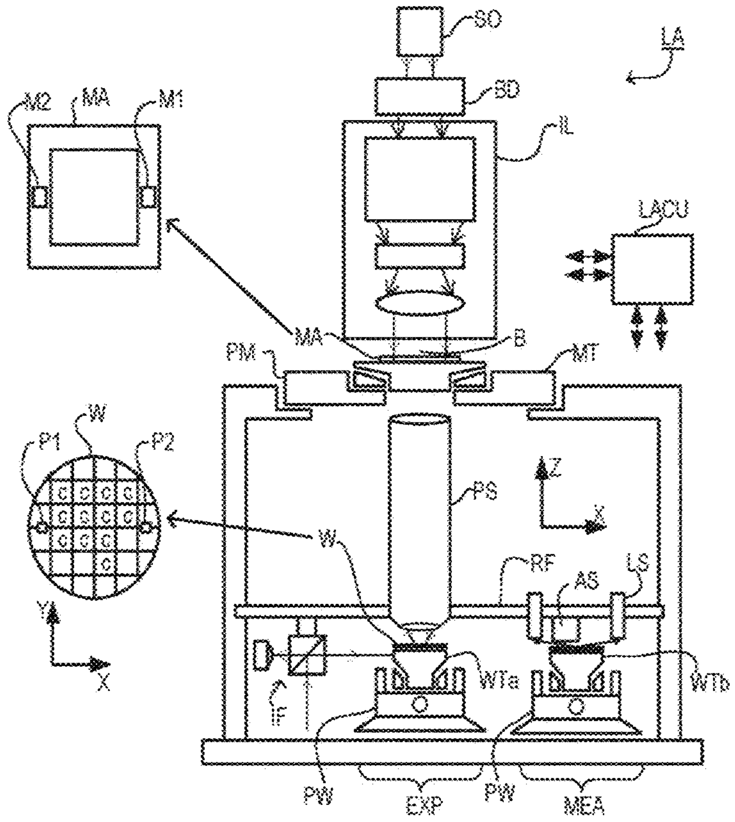
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a support (e.g., a mask table) T constructed to support a patterning device (e.g., a mask) MA and connected to a first positioner PM configured to accurately position the patterning device MA in accordance with certain parameters, one or more substrate supports (e.g., a wafer table) WTa and WTb constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253B2, which is incorporated herein by reference.

Lithographic apparatus LA in this example is of a so-called dual stage type which has two substrate tables WTa and WTb and two stations—an exposure station and a measurement station-between which the substrate tables can be moved. While one substrate on one substrate table is being exposed at the exposure station EXP, another substrate can be loaded onto the other substrate table at, e.g., the measurement station MEA or at another location (not shown) or can be processed at measurement station MEA. A substrate table with a substrate can be located at measurement station MEA so that various preparatory steps may be carried out. The preparatory steps may include mapping the surface height of the substrate using a level sensor LS and/or measuring the position of alignment marks on the substrate using an alignment sensor AS. Due to inaccuracies in creating the marks and also due to deformations of the substrate that occur throughout its processing, the set of marks may next to translation and rotation have undergone more complex transformations. Consequently, in addition to measuring position and orientation of the substrate, the alignment sensor in practice may measure in detail the positions of many marks across the substrate area, if the apparatus LA is to print product features at the correct locations with high accuracy. The measurement of alignment marks can therefore be time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. An embodiment of the invention can be applied in an apparatus with only one substrate table, or with more than two.

In addition to having one or more substrate supports, the lithographic apparatus LA may comprise a measurement stage (not shown). The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The apparatus further includes a lithographic apparatus control unit LACU which controls all the movements and measurements of various actuators and sensors of the lithographic apparatus (such as those described). Control unit LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
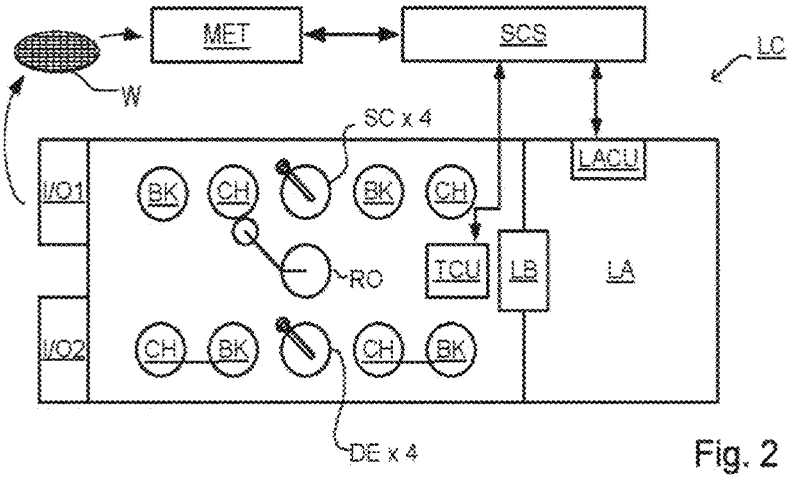
FIG. 2 depicts a schematic overview of a lithographic cell

As shown in FIG. 2 the lithographic apparatus LA may form part of a lithographic cell LC, also sometimes referred to as a lithocell or (litho)cluster, which often also includes apparatuses to perform pre- and post-exposure processes on a substrate W. Conventionally these apparatuses includes one or more spin coaters SC to deposit resist layers, one or more developers DE to develop exposed resist, one or more chill plates CH and one or more bake plates BK, e.g. for conditioning the temperature of substrates W e.g. for conditioning solvents in the resist layers. A substrate handler, or robot, RO picks up substrates W from input/output ports I/O1, I/O2, moves them between the different processing apparatuses and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, one or more inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus MET, which may also be referred to as a metrology apparatus or metrology tool, is used to determine one or more properties of the substrates W, and in particular, how one or more properties of different substrates W vary or how one or more properties associated with different layers of the same substrate W vary from layer to layer. The inspection apparatus may be constructed to identify defects on the substrate W and may, for example, be part of the lithocell LC, or may be integrated into the lithographic apparatus LA, or may even be a stand-alone device. The inspection apparatus may measure the one or more properties on a latent image (an image in a resist layer after the exposure), or on a semi-latent image (an image in a resist layer after a post-exposure bake step), or on a developed resist image (in which the exposed or unexposed parts of the resist have been removed), or even on an etched image (after a pattern transfer step such as etching).

Currently, when hardware (including consumables such as the wafer) and/or software changes are implemented on a lithographic apparatus (hereafter referred to as a scanner), several performance/qualification tests are performed to qualify and assess the performance of the scanner subsequent to the change(s). This may comprise assessing the performance of one or more particular exposure layouts and identifying preferred and/or poor performing exposure layouts. Such tests typically comprise performing special exposures on wafers according to said exposure layout(s) and measuring the exposed wafers. These exposures cost a lot of time and money, as the wafers are expensive and the exposure and measurement time is significant. This places a practical limit on the number of wafers that can be exposed, which limits the number of tests that can be performed. Because there are only a limited number of tests that can be performed practically, it is unlikely that all best and/or worst case performance scenarios which might occur are tested and accounted for. Therefore, the scanner might not function as well as it could. Additionally, a user may use e.g., different exposure layouts during manufacturing than the test exposure layouts.

Consequently a different qualification strategy is proposed which addresses the above issues. Such a method comprises performing similar types of exposure tests on a substrate coated with photoresist in accordance with multiple different exposure layouts, but using insufficient energy or intensity of the scanner exposure radiation for exposure of the photoresist. Such dummy exposures may be performed with no exposure energy, or with a very small exposure energy (e.g., well below the exposure sensitivity threshold of the resist). The latter option may be used when the scanner is configured not to operate unless set to output at least some exposure energy.

Such a dummy exposure test may comprise performing dummy exposures over a whole wafer (or a portion thereof) according to an exposure layout in the same manner as with a normal exposure, other than in the exposure energy used (which may be zero, nominal or at least below the exposure threshold of the resist). All other control aspects, where possible, should be the same as a normal exposure (e.g., inter alia: stage control of all stages, lens control, exposure time durations, alignment measurements etc.).

During the dummy exposures, one or more exposure parameters (e.g., parameters of the scanner, reticle, wafer or anything else relating to the exposure) may be monitored and the resultant exposure parameter data input into a model to determine predicted (modeled) performance parameters (e.g., one or more of: edge placement, contrast, overlay, focus, defectivity or any other parameter indicative of performance) and therefore evaluate the exposure performance.

In this way, many dummy wafer exposures may be performed, so as to qualify a large amount of different exposure layouts (e.g., which may include different mark/feature placement), all using a single wafer (or a single wafer for each wafer type or wafer parameter such as wafer thickness), and without the need for subsequent metrology. The advantage of such a test is that it identifies the layouts (including mark/feature placement) which have the best and/or worst performance, while significantly reducing test time. Such identified best and/or worst layouts may also be tested (verified) via real exposures and readouts in a subsequent test.

As such, because the test wafer(s) can be used multiple times, there is the possibility to test multiple scenarios and more test locations on the wafer, and therefore more problem areas and/or scenarios can be identified. Once the problem areas are identified, there is also the possibility to perform real exposures at and/or of these problem areas. In such a manner, the scanner configuration can be optimized.

By way of a specific example, a qualification test may be used to assess the impact of using special wafers, such as a thick wafer, on a specific machine. In such an example, the cost of the special wafer is high and there are very few available. Because of this, if using the present qualification test, only a very limited number of exposures are possible, because there are insufficient test wafers for more exposures. The proposed method will allow many more (e.g., an almost limitless number) of dummy exposures to be performed, to qualify exposure layouts for such a special or thick wafer.

Exposure parameters may include any parameters which change during exposure. These may include inter alia: all servo related parameters, all force, movement and positional data (e.g., positions, velocities, forces and accelerations (parallel to the substrate plane and/or normal to the substrate plane), any temperatures (including reticle temperature, wafer temperature, water temperatures (e.g., in immersion applications) or other fluid temperatures), any fluid flows or pressures. Such exposure parameters may relate, where applicable, to any of the stages (e.g., reticle stage and wafer stage), any lens (e.g., lens parameters such as lens overpressure, lens cooling water, lens temperature), the wafer, the reticle, any immersion liquid, any other fluid, ambient conditions (air pressures/temperatures etc.) or any other component of the scanner (e.g., grid plate, or more specifically movement or acceleration of the grid plate). Where the scanner is a two-stage scanner such as illustrated in FIG. 1, the exposure parameters may relate to measure side and/or exposure side exposure parameters.

An exposure layout may describe one or more of: the field size, field layout, intrafield layout (e.g., number of dies and their arrangement within a field) and alignment mark or other feature locations.

By way of a further specific example, it is known that pressure waves caused by (e.g., wafer stage) movement on the measure side affects the lens on the expose side, which in turn affects exposure performance on resist. As such, an exposure parameter may comprise a pressure metric relating to these pressure waves. US2005139790A1 and U.S. Ser. No. 10/551,746B2 describe methods of using pressure waves within the lithographic apparatus and/or over lens elements in control methods; these documents are incorporated herein by reference. As such, an exposure parameter may comprise a pressure metric relating to such pressure waves within the lithographic apparatus and/or over lens elements therein.

Ideally, all available exposure parameters may be used to evaluate exposure performance. However, there may be practical limitations in doing this due to the large number of available parameters, and huge amount of data that would entail. Therefore the method may comprise a smart tracing step to identify important or key exposure parameters. Such key exposure parameters may comprise those known to be important from expert knowledge, and/or may include those determined as important via an initial step. For example, this may comprise monitoring all exposure parameter signals during a dummy exposure run. Exposure parameter signals may be selected based on how much they vary during the test (e.g., those having a variance above a threshold or a number of signals having the highest variance). Alternatively or in addition, the exposure parameter signals known or determined to have significant impact on the performance parameter(s) being modeled may be selected. This may be apparent from the model, determined by modeling the signals and/or known via expert knowledge.

Key exposure parameters may also be selected based on how the exposure performance is being evaluated (e.g., which performance parameter(s) is/are being modeled). By way of a simple example, substrate plane parallel (x/y) exposure parameters will be more relevant when the performance parameter being modeled is overlay, and substrate plane normal (z) exposure parameters will be more relevant when the performance parameter being modeled is focus.

Once the exposure parameter data of a particular test has been obtained, it can be inputted into a model e.g., machine learning or other mathematical or physics based model which has been trained and/or configured to correlate the exposure parameter data to performance of the scanner. In this way, the model can infer performance parameter data for one or more performance parameters from said exposure parameter data.

A particular benefit of the proposed method is that testing is not limited to a (typically standard) test layout. A large pool of (e.g., application representative) layouts and feature positions can be included, and the performance can be carefully simulated, so as to identify the best and worst performance.

The concepts can be further extended to performing such dummy exposure tests on actual product and feature layouts.

It should also be appreciated that according to present qualification test methods, mark (or feature) position dependency is difficult to evaluate as there is a limited range of marks available on a reticle for each performance test (overlay, imaging, focus). Using the dummy exposure test methods disclosed herein, it is possible to simulate a reticle with a (very) dense mark population (the actual reticle pattern is unimportant as no actual exposure is being performed) and identify which mark position for which layout will provide the best and/or worst performance. The traced exposure parameters can be resampled over the dense (simulated) mark positions and the performance of the machine can be assessed.

In addition (or as an alternative) to identifying preferred or poor layout options, the methods may also identify problem areas (e.g., problem field or dies) in otherwise acceptable layouts, such that problem areas can be considered when controlling the exposure in a manufacturing setting (e.g., to aid determination of a correction strategy to mitigate the effect of the problem area(s)). The dummy exposure test may also identify certain effects (e.g., scan-up-scan-down effects etc.), therefore enabling better correction of these effects.

This dummy exposure test is far cheaper than present qualification testing, and also enables improvement in understanding of new product performance. An exposure and readout based qualification test is expensive in terms of time and also material. The dummy exposure test, by contrast, takes only a few minutes, making it possible to quantify a huge range of layouts.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc. In that regard, the processed "substrates" may be semiconductor wafers, or they may be other substrates, according to the type of product being manufactured.

Although specific reference may be made in this text to embodiments of the invention in the context of a lithographic apparatus, embodiments of the invention may be used in other apparatus. Embodiments of the invention may form part of a patterning device inspection apparatus, a metrology apparatus, or any apparatus that measures or processes an object such as a wafer (or other substrate) or a mask (or other patterning device). These apparatuses may be generally referred to as lithographic tools. Such a lithographic tool may use vacuum conditions or ambient (non-vacuum) conditions.

In the present document, the terms "radiation" and "beam" are used to encompass all types of radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Although specific reference may have been made above to the use of embodiments of the invention in the context of optical lithography, it will be appreciated that the invention, where the context allows, is not limited to optical lithography and may be used in other applications, for example imprint lithography.

The terms "optimizing" and "optimization" as used herein refers to or means adjusting an apparatus (e.g., a lithography apparatus), a process, etc. such that results and/or processes have more desirable characteristics, such as higher accuracy of projection of a design pattern on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, these inventions have been grouped into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the present disclosure to the particular form disclosed, but to the contrary, the intention is to cover all modifications, equivalents, and alternatives falling within the spirit and scope of the inventions as defined by the appended claims.

Modifications and alternative embodiments of various aspects of the inventions will be apparent to those skilled in the art in view of this description. Accordingly, this description and the drawings are to be construed as illustrative only and are for the purpose of teaching those skilled in the art the general manner of carrying out the inventions. It is to be understood that the forms of the inventions shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description. Changes may be made in the elements described herein without departing from the spirit and scope of the invention as described in the following claims. Headings used herein are for organizational purposes only and are not meant to be used to limit the scope of the description.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method of performing a lithographic performance qualification test, the method comprising:

obtaining exposure layout data describing multiple exposure layouts, each exposure layout relating to exposure of multiple exposure fields on a substrate;

performing one or more dummy exposures on a substrate comprising photoresist for each of the one or more exposure layouts, the one or more dummy exposures using no exposure illumination or exposure illumination having an exposure energy below an exposure threshold of the photoresist;

monitoring one or more exposure parameters of each dummy exposure to obtain exposure parameter data; and identifying the exposure layout and/or one or more exposure parameters with a best and/or worst performance by evaluating lithographic performance of each dummy exposure and/or its corresponding exposure layout from the exposure parameter data respective to that dummy exposure.

2. The method as claimed in claim 1, wherein each exposure layout of the exposure layout data describes one or more selected from: field size, field layout, intrafield layout and/or the number and locations of alignment marks or other features.

3. The method as claimed in claim 1, wherein the one or more exposure parameters comprise one or more parameters which change during exposure.

4. The method as claimed in claim 1, wherein the one or more exposure parameters comprise one or more selected from: any servo related parameter, any force parameter, any movement parameter, any positional parameter, any temperature parameter, any flow parameter, and/or any pressure parameter, of the one or more dummy exposures and/or of a lithographic apparatus used to perform the one or more dummy exposures.

5. The method as claimed in claim 1, wherein the one or more exposure parameters relate to one or more selected from: a substrate stage, a reticle stage, the substrate, any lens, any fluid, a grid plate, and/or an immersion hood, of a lithographic apparatus used to perform the one or more dummy exposures.

6. The method as claimed in claim 1, wherein the evaluating lithographic performance comprises inputting the exposure parameter data into a model trained or configured to infer performance parameter data for one or more performance parameters from the exposure parameter data.

7. The method as claimed in claim 6, wherein the one or more performance parameters comprise one or more selected from: edge placement, contrast, overlay, focus or defectivity.

8. The method as claimed in claim 6, further comprising selecting the one or more exposure parameters based on:

the impact of the exposure parameter on the performance parameter; and/or the specific one or more performance parameters being determined.

9. The method as claimed in claim 1, further comprising selecting the one or more exposure parameters based on:

expert knowledge; and/or variance of the exposure parameter during a dummy exposure test.

10. The method as claimed in claim 1, wherein the evaluating lithographic performance comprises identifying one or more preferred and/or non-preferred exposure layouts out of the one or more exposure layouts.

11. The method as claimed in claim 1, wherein the performing one or more dummy exposures comprises simulating the exposure with a reticle having a dense alignment mark population; and the evaluating comprises evaluating alignment mark positioning for one or more of the exposure layouts.

12. The method as claimed in claim 1, wherein the evaluating lithographic performance comprises identifying one or more problem areas or exposure effects in at least one of the one or more exposure layouts.

13. The method as claimed in claim 12, further comprising determining a correction strategy to mitigate the effect of the one or more problem areas or exposure effects.

14. The method as claimed in claim 1, further comprising repeating performance of the performing the one or more dummy exposures, monitoring and evaluating for different exposure layouts on the same substrate.

15. A non-transient computer program carrier comprising a computer program therein, the computer program, when run on a suitable apparatus, configured to cause the apparatus to at least:

obtain exposure layout data describing multiple exposure layouts, each exposure layout relating to exposure of multiple exposure fields on a substrate;

obtain exposure parameter data from the performance of one or more dummy exposures on a substrate comprising photoresist for each of the one or more exposure layouts, the one or more dummy exposures using no exposure illumination or exposure illumination having an exposure energy below an exposure threshold of the photoresist; and identify the exposure layout and/or one or more exposure parameters with a best and/or worst performance by evaluating lithographic performance of each dummy exposure and/or its corresponding exposure layout from the exposure parameter data respective to that dummy exposure.

16. A processing arrangement comprising:

the non-transient computer program carrier of claim 15; and a processor operable to run the computer program comprised on the non-transient computer program carrier.

17. A lithographic apparatus comprising the processing arrangement of claim 16.

18. The computer program carrier as claimed in claim 15, wherein each exposure layout of the exposure layout data describes one or more selected from: field size, field layout, intrafield layout and/or the number and locations of alignment marks or other features.

19. The computer program carrier as claimed in claim 15, wherein the one or more exposure parameters comprise one or more parameters which change during exposure.

20. The computer program carrier as claimed in claim 15, wherein the one or more exposure parameters comprise one or more selected from:

any servo related parameter, any force parameter, any movement parameter, any positional parameter, any temperature parameter, any flow parameter, and/or any pressure parameter, of the one or more dummy exposures and/or of a lithographic apparatus used to perform the one or more dummy exposures.

* * * * *